United States Patent [19]
Burnham

[11] Patent Number: 6,160,418
[45] Date of Patent: Dec. 12, 2000

[54] INTEGRATED CIRCUIT WITH SELECTIVELY DISABLED LOGIC BLOCKS

[75] Inventor: James L. Burnham, Morgan Hill, Calif.

[73] Assignee: Xilinx, Inc., San Jose, Calif.

[21] Appl. No.: 09/231,532

[22] Filed: Jan. 14, 1999

[51] Int. Cl.$^7$ ................................................. H03K 19/177
[52] U.S. Cl. ............................................. 326/38; 326/41
[58] Field of Search .......................................... 326/37–41

[56] References Cited

U.S. PATENT DOCUMENTS

| | | | |
|---|---|---|---|
| Re. 34,363 | 8/1993 | Freeman et al. . | |
| 3,849,760 | 11/1974 | Endou et al. | 382/205 |
| 5,084,636 | 1/1992 | Yoneda | 326/39 |
| 5,237,218 | 8/1993 | Josephson et al. | 326/41 |
| 5,237,219 | 8/1993 | Cliff | 326/41 |
| 5,258,668 | 11/1993 | Cliff et al. | 326/39 |
| 5,300,831 | 4/1994 | Pham et al. | 326/39 |
| 5,341,044 | 8/1994 | Ahanin et al. | 326/39 |
| 5,343,406 | 8/1994 | Freeman et al. | 364/490 |
| 5,367,208 | 11/1994 | El Gamal et al. | 326/39 |
| 5,394,031 | 2/1995 | Britton et al. | 326/38 |
| 5,457,408 | 10/1995 | Leung | 326/38 |
| 5,705,938 | 1/1998 | Kean | 326/39 |
| 5,894,228 | 4/1999 | Reddy et al. | 326/41 |

FOREIGN PATENT DOCUMENTS

| | | |
|---|---|---|
| A0253530 | 6/1987 | European Pat. Off. . |
| WO92/20157 | 11/1992 | WIPO . |
| WO94/10754 | 11/1993 | WIPO . |
| WO94/01867 | 1/1994 | WIPO . |

OTHER PUBLICATIONS

"The Programmable Logic Data Book", published Sep., 1996, in its entirety and also specifically pp. 4–54 to 4–79 and 4–253 to 4–286, available from Xilinx, Inc., 2100 Logic Drive, San Jose, California 95124.

"Core Solutions Data Book", published May, 1997, pp. 2–5 to 2–13 available from Xilinx, Inc., 2100 Logic Drive, San Jose, California 95124.

"The Programmable Logic Data Book", published 1994, available from Xilinx, Inc., 2100 Logic Drive, San Jose, California 95124, pp. 2–105 to 2–132 and 2–231 to 2–238.

D.D. Gajski, et al., "Computer Architecture" IEEE Tutorial Manual, IEEE Computer Society, 1987, pp. v–i.

"New IEEE Standard Dictionary of Electrical and Electronics Terms", Fifth Edition, 1993, p. 1011.

"IEEE Standard Test Access Port and Boundary–Scan Architecture", IEEE Std. 1149.1, published Oct. 21, 1993.

David A. Patterson and John L. Hennessy, "Computer Architecture: A Quantitive Approach", pp. 200–201, 1990.

Betty Prince, "Semiconductor Memories", copyright 1983, 1991, John Wiley & Sons, pp. 149–174.

Hodges, et al., "Analog MOS Integrated Circuits" IEEE Press, 1980, pp. 2–11.

"The Programmable Logic Data Book", published 1998, available from Xilinx, Inc., 2100 Logic Drive, San Jose, California 95124, pp. 4–46 to 4–59.

*Primary Examiner*—Michael Tokar
*Assistant Examiner*—Don Phu Le
*Attorney, Agent, or Firm*—Edward S. Mao, Esq.; Bever, Hoffman & Harms; Lois D. Cartier

[57] ABSTRACT

A method and circuit is provided for creating multiple product lines from a single silicon implementation of an integrated circuit (IC). Specifically, logic blocks within the IC are selectively disabled after manufacturing the IC to create various ICs of different functionality from a single silicon implementation of the IC. In one embodiment, a first logic block of the IC is coupled to a disable circuit by a first disable line and a second logic block of the IC is coupled to the disable circuit by a second disable line. The disable circuit can disable the first logic block by driving the first disable line to a disable logic state. Similarly, the disable circuit can disable the second logic block by driving the second disable circuit to the disable logic state. In an FPGA embodiment of the present invention, the first logic block is a row of configurable logic blocks (CLBs) and the second logic block is a column of CLBs.

24 Claims, 11 Drawing Sheets

INTEGRATED CIRCUIT WITH SELECTIVELY DISABLED LOGIC BLOCKS

CROSS-REFERENCE TO RELATED APPLICATIONS

This application relates to U.S. patent application Ser. No. 09/000,519, entitled "DECODER STRUCTURE AND METHOD FOR FPGA CONFIGURATION" by Gary R. Lawman, which is incorporated herein by reference.

FIELD OF THE INVENTION

The present invention relates to integrated circuits (ICs) such as field programmable gate arrays (FPGAs). More specifically, the present invention relates to methods for selectively disabling specific portions of an IC.

BACKGROUND OF THE INVENTION

Due to advancing semiconductor processing technology, integrated circuits (ICs) have greatly increased in functionality and complexity. For example, ICs such as field programmable gate arrays (FPGAs), application specific integrated circuits (ASICs), microprocessors and programmable logic devices (PLDs), can incorporate ever-increasing numbers of functional logic blocks and more flexible interconnect structures to provide greater functionality and flexibility.

FIG. 1 is a simplified schematic diagram of a conventional FPGA 110. FPGA 110 includes user logic circuits such as input/output blocks (IOBs), configurable logic blocks (CLBs), and programmable interconnect 130, which contains programmable switch matrices (PSMs). Furthermore, FPGA 110 contains bonding pads (PADs) to connect the various user logic circuits to pins (not shown) of FPGA 110. In some FPGAs, the PADs are incorporated as part of the IOBs. Each IOB and CLB can be configured through configuration port 120 to perform a variety of functions. Configuration port 120 is typically coupled to external pins of FPGA 110 through various bonding pads. Programmable interconnect 130 can be configured to provide electrical connections between the various CLBs and IOBs by configuring the PSMs and other programmable interconnection points (PIPS, not shown) through configuration port 120. Typically, the IOBs can be configured to drive output signals or to receive input signals from the corresponding PADs of FPGA 110.

FPGA 110 also includes dedicated internal logic. Dedicated internal logic performs specific functions and can only be minimally configured by a user. For example, configuration port 120 is one example of dedicated internal logic. Other examples may include dedicated clock nets (not shown), power distribution grids (not shown), and boundary scan logic (i.e. IEEE Boundary Scan Standard 1149.1, not shown).

FPGA 110 is illustrated with 16 CLBs, 16 IOBS, 9 PSMs, and 16 PADs for clarity only. Actual FPGAs may contain thousands of CLBS, thousands of PSMs, hundreds of IOBS, and hundreds of PADs. Furthermore, FPGA 110 is not drawn to scale. For example, a typical PAD occupies far more area than a CLB, PSM, or IOB. The ratio of the number of CLBs, IOBs, PSMs, and PADs can also vary.

FPGA 110 also includes dedicated configuration logic circuits to program the user logic circuits. Specifically, each CLB, IOB, PSM, and PIP contains a configuration memory (not shown) which must be configured before each CLB, IOB, PSM, or PIP can perform a specified function. Typically the configuration memories within an FPGA use static random access memory (SRAM) cells. The configuration memories of FPGA 110 are connected by a configuration structure (not shown) to configuration port 120 through a configuration access port (CAP) 125. A configuration port (a set of pins used during the configuration process) provides an interface for external configuration devices to program the FPGA. The configuration memories are typically arranged in rows and columns. The columns are loaded from a frame register which is in turn sequentially loaded from one or more sequential bitstreams. (The frame register is part of the configuration structure referenced above.) In FPGA 110, configuration access port 125 is essentially a bus access point that provides access from configuration port 120 to the configuration structure of FPGA 110.

FIG. 2 illustrates a conventional method used to configure FPGA 110. Specifically, FPGA 110 is coupled to a configuration device 230 such as a serial programmable read only memory (SPROM), an electrically programmable read only memory (EPROM), or a microprocessor. Configuration port 120 receives configuration data, usually in the form of a configuration bitstream, from configuration device 230. Typically, configuration port 120 contains a set of mode pins, a clock pin and a configuration data input pin. Configuration data from configuration device 230 is transferred serially to FPGA 110 through the configuration data input pin. In some embodiments of FPGA 110, configuration port 120 comprises a set of configuration data input pins to increase the data transfer rate between configuration device 230 and FPGA 110 by transferring data in parallel. However, due to the limited number of dedicated function pins available on an FPGA, configuration port 120 usually has no more than eight configuration data input pins. Further, some FPGAs allow configuration through a boundary scan chain. Specific examples for configuring various FPGAs can be found on pages 4-46 to 4-59 of "The Programmable Logic Data Book", published in January, 1998 by Xilinx, Inc., and available from Xilinx, Inc., 2100 Logic Drive, San Jose, Calif. 95124, which pages are incorporated herein by reference. Additional methods to program FPGA's are described by Lawman in commonly assigned, co-pending U.S. patent application Ser. No. 09/000,519, entitled "DECODER STRUCTURE AND METHOD FOR FPGA CONFIGURATION" by Gary R. Lawman, which is referenced above.

As explained above, actual FPGAs can have thousands of CLBS, IOBs, PSMs, and PIPS. Furthermore, as semiconductor processing techniques improves, FPGAs of greater and greater complexity can be created. However, processing techniques for bonding pads and pins for integrated circuits have not evolved as rapidly as semiconductor processing techniques. Consequently, complex integrated circuits such as ASICs, microprocessors, and FPGAs are increasingly pad limited rather than circuit limited. Thus, manufacturers of integrated circuits can provide more functionality in an integrated circuit than a customer may need.

However, many customers are unwilling to pay for the unneeded functionality. Therefore, manufacturers of integrated circuits must provide multiple product lines having different functionality at different price points. For example, manufacturers of FPGAs may provide FPGA product lines having differing numbers of CLBs and PSMs. However, each product line entails development and manufacturing costs for the manufacturer of the integrated circuit. Furthermore, the manufacturer may misjudge market demands for different product lines and cause shortages of one product line and excess inventory in another product line. Hence, there is a need for a method or structure to satisfy differing needs of customers for integrated circuit functionality, without the cost and risk of creating multiple ICs to support multiple product lines.

SUMMARY OF THE INVENTION

The present invention provides the versatility of multiple product lines by selectively disabling logic blocks within an integrated circuit. In accordance with one embodiment of the present invention, an IC contains multiple logic blocks and a disable circuit. The disable circuit drives separate disable lines to each logic block that can be selectively disabled. The disable circuit disables a particular logic block by driving the corresponding disable line to a disable logic state. Specifically, if a first logic block of the IC is coupled to the disable circuit by a first disable line, the disable circuit disables the first logic block by driving the first disable line to the disable logic state. Similarly, if a second logic block of the IC is coupled to the disable circuit by a second disable line, the disable circuit disables the second logic block by driving the second disable line to a disable logic state. In an FPGA embodiment of the present invention, the logic blocks can be groups of CLBs. In one embodiment, rows of CLBs and columns of CLBs can be selectively disabled to create FPGAs having different CLB matrix sizes from a single IC implementation.

In one embodiment, the disable circuit modifies the reset circuitry of the logic blocks. Specifically, the reset terminals of a logic block are coupled to a disable line from the disable circuit rather than a global reset line. If a logic block is to be disabled, the disable circuit drives the corresponding disable line to cause the logic block to remain in a reset state. If the logic block is to be enabled, the disable circuit drives the corresponding disable line to the same logic state as the global reset line.

In another embodiment of the present invention, each logic block contains a separate disable circuit. For example, in an FPGA each CLB may contain a separate disable circuit. In one embodiment, the disable circuit is coupled to the global reset line and drives a disable line to the reset terminals of the logic block. If the logic block is to be disabled, the disable circuit causes the logic block to remain in a reset state regardless of the logic state of the global reset line by driving the disable line to disable logic state. If the logic block is to be enabled, the disable circuit drives the disable line to the same logic state as the global reset line. The present invention will be more fully understood in view of the following description and drawings.

DETAILED DESCRIPTION OF THE DRAWINGS

Figure 1:
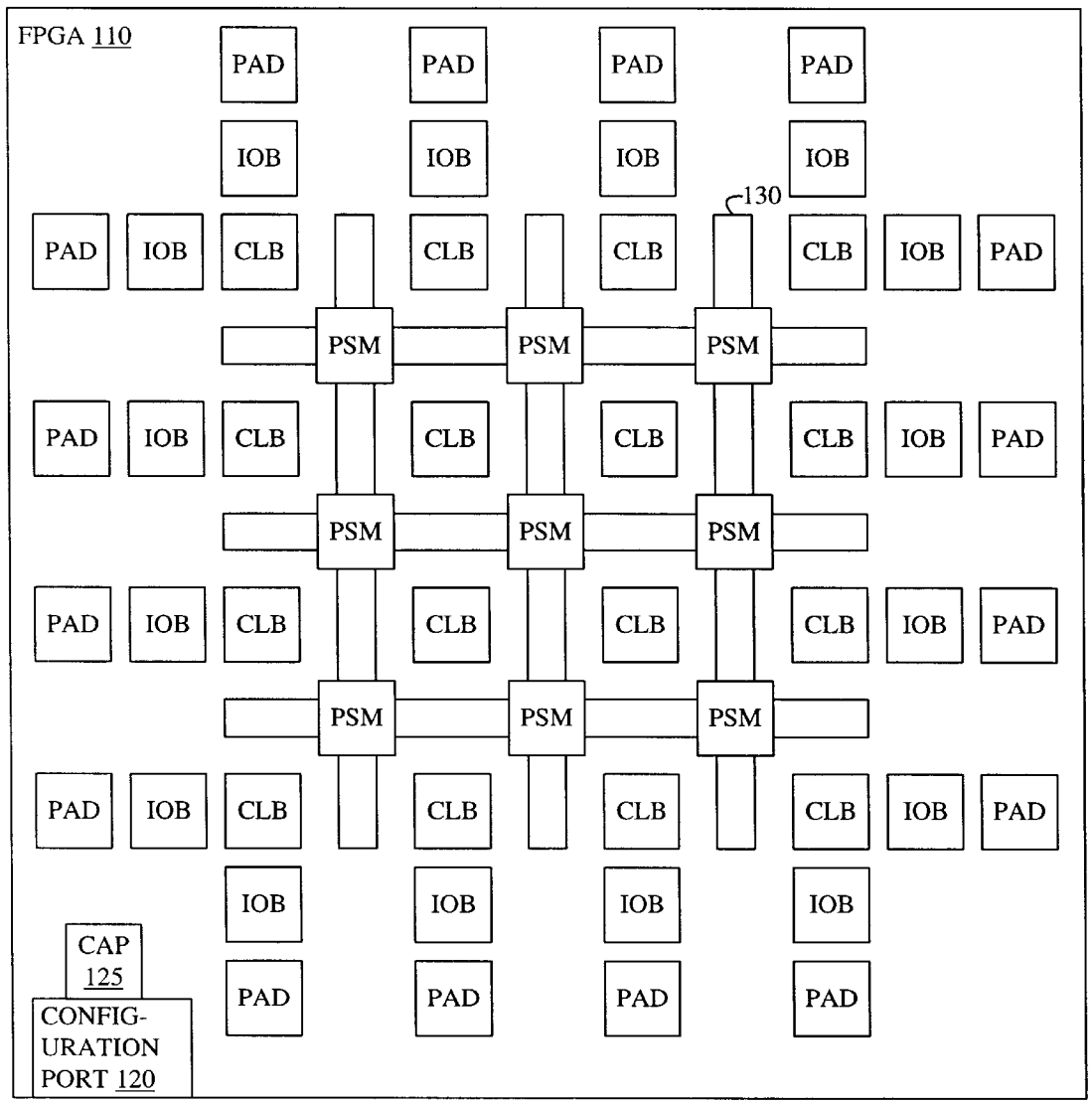
FIG. 1 is a simplified schematic diagram of a conventional FPGA.
Figure 2:
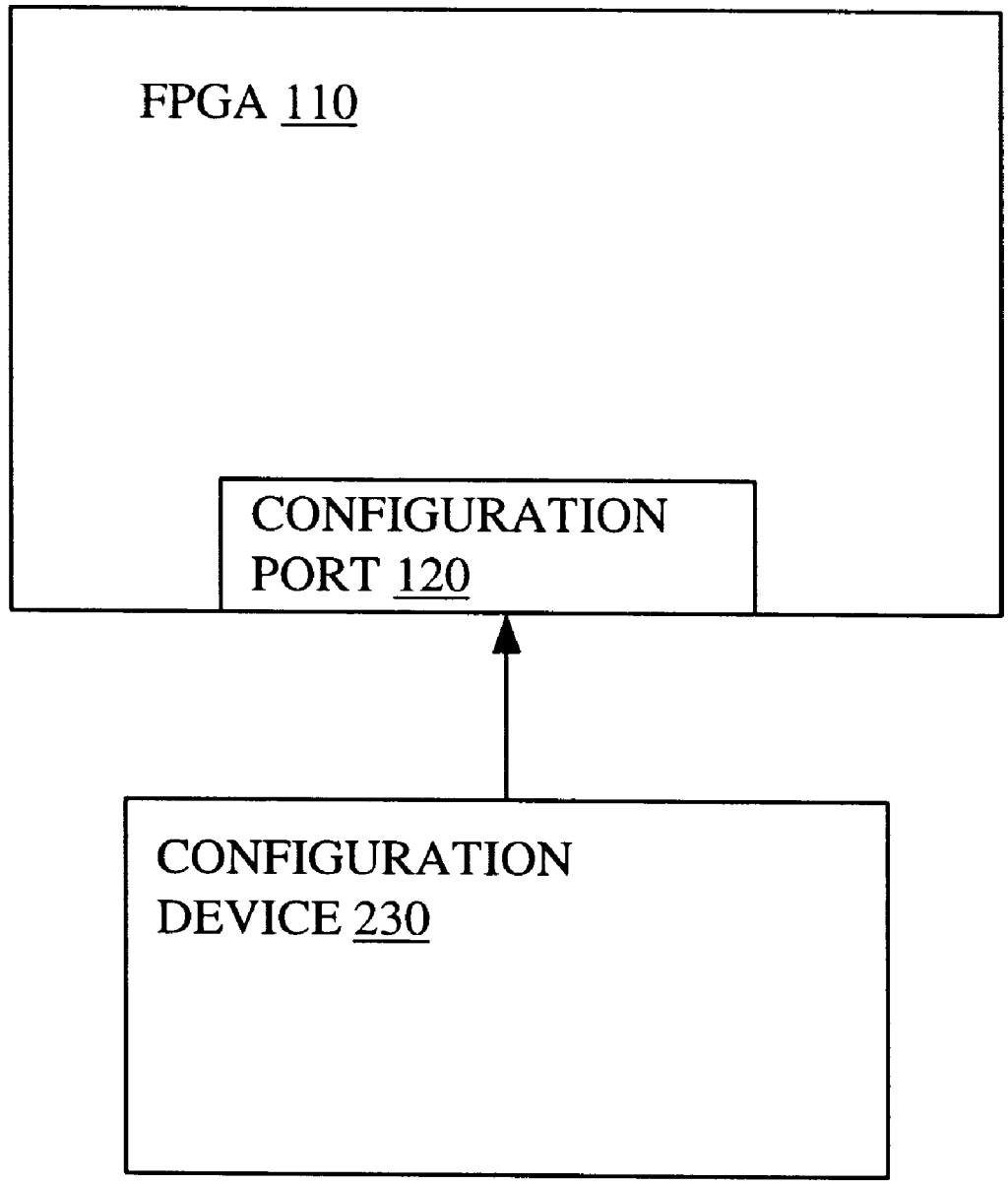
FIG. 2 is a prior art schematic diagram of an FPGA configured with a configuration device.
Figure 3:
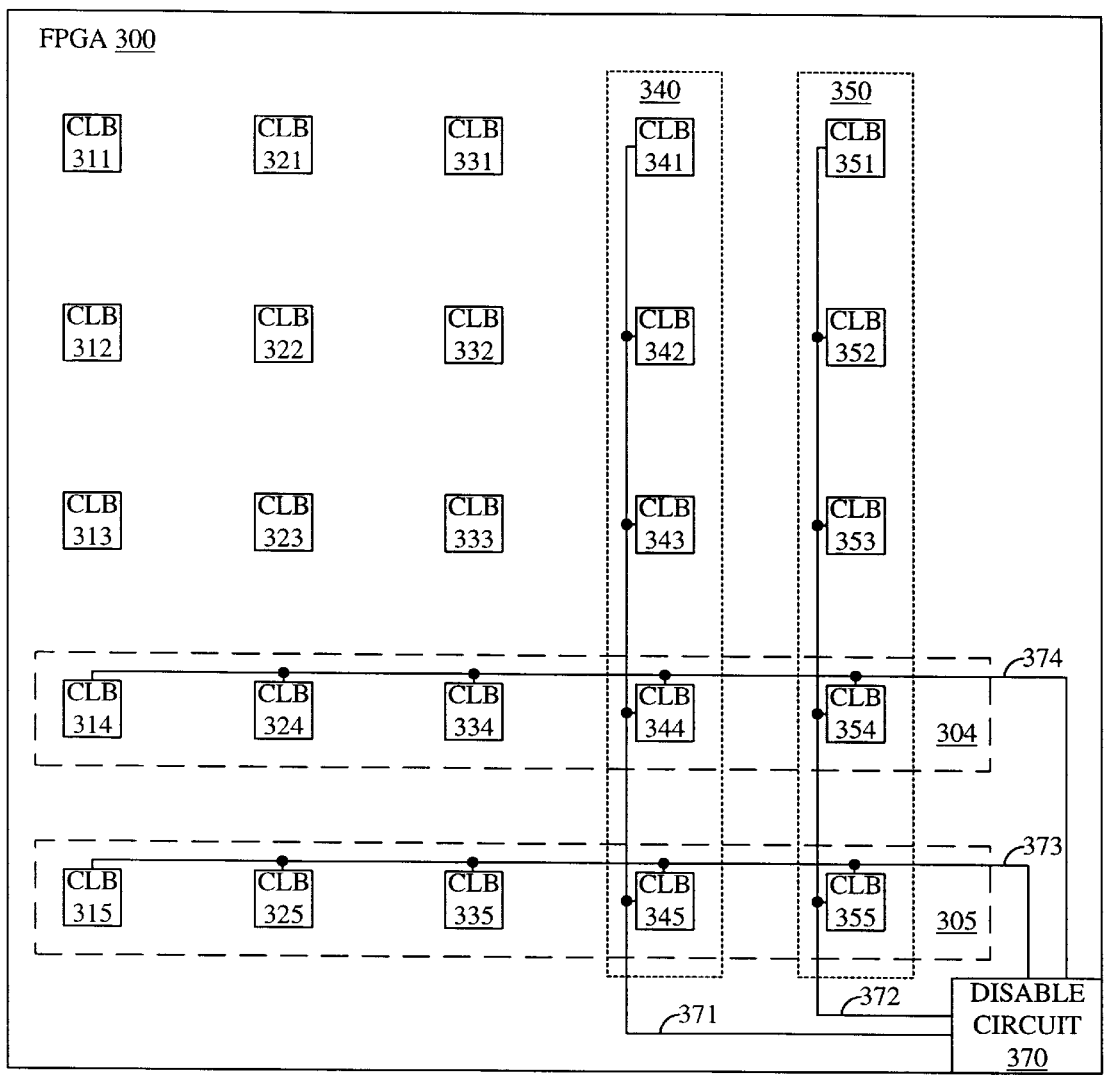
FIG. 3 is a simplified schematic diagram of an FPGA in accordance with one embodiment of the present invention.

FIG. 3 is a simplified schematic diagram of an FPGA 300 in accordance with one embodiment of the present invention. The programmable interconnect, IOBs, and PADs of FPGA 300 are omitted in FIG. 3 for clarity. FPGA 300 comprises an array of CLBs, a disable circuit 370, and disable signals 371–374. Portions of FPGA 300 can be selectively disabled to create several product lines from FPGA 300. Specifically, disable circuit 370 can disable a CLB column 350 comprising CLBs 351–355 by driving disable signal 372 to a disable logic state (e.g., logic low). Similarly, disable circuit 370 can disable a CLB column 340 comprising CLBs 341 to 345 by driving disable line 371 to a disable logic state. Furthermore, disable circuit 370 can disable a CLB row 304 comprising CLBs 314, 324, 334, 344, and 354 by driving disable line 374 to the disable logic state. Similarly, disable circuit 370 can disable a CLB row 305 comprising CLBs 315, 325, 335, 345, and 355 by driving disable line 373 to the disable logic state.

Disable circuit 370 can be configured by the manufacturer of FPGA 300 after manufacturing of FPGA 300 and prior to shipping FPGA 300 to an end user. Disable lines 371–374 can be configured independently to disable specific rows or columns of CLBs. Thus, FGPA 300 can be configured to have a 3×3 CLB matrix, a 3×4 CLB matrix, a 3×5 CLB matrix, a 4×3 CLB matrix, a 4×4 CLB matrix, a 4×5 CLB matrix, a 5×3 CLB matrix, a 5×4 CLB matrix, or a 5×5 CLB matrix. The 5×5 CLB matrix of FPGA 300 is given as an example. As explained above, actual FPGAs can have thousands of CLBs. The principles of disabling CLB rows or CLB columns as illustrated in FIG. 3 can be applied to larger CLB matrices. In some embodiments, a single disable line is coupled to disable multiple CLB rows or multiple CLB columns.

In one embodiment of the present invention, disable circuit 370 modifies the global reset signal to CLBs 314–315, 324–325, 334–335, 341–345, and 351–355. Specifically, the global reset terminals (not shown) of the CLBs in CLB column 340 (i.e. CLBS 341–344) are coupled to disable line 371 rather than a global reset line !R (as used herein, "!" is used to denote active low signals and lines). Similarly, the global reset terminals of the CLBs in CLB column 350 (i.e. CLBs 351–355) are coupled to disable line 372; the global reset terminals of the CLBs in CLB row 304 (i.e. CLBs 314, 324, 334, 344, and 354) are coupled to disable line 374; and the global reset terminals of the CLBs in CLB row 305 (i.e. CLBs 315, 325, 335, 345, and 355) are coupled to disable line 373. Since CLB 344 can be disabled by either disable line 374 or disable line 371, the global reset terminal of CLB 344 is coupled to both disable lines 371 and 374 through an AND gate (not shown). Specifically, the output terminal of the AND gate is coupled to the global reset terminal, a first input terminal of the AND gate is coupled to disable line 371, and a second input terminal of the AND gate is coupled to disable line 374. Similarly, the global reset terminal of CLB 354 is coupled to both disable lines 374 and 372; the global reset terminal of CLB 345 is coupled to both disable lines 371 and 373; and the global reset terminal of CLB 355 is coupled to both disable lines 373 and 372.

Figure 4:
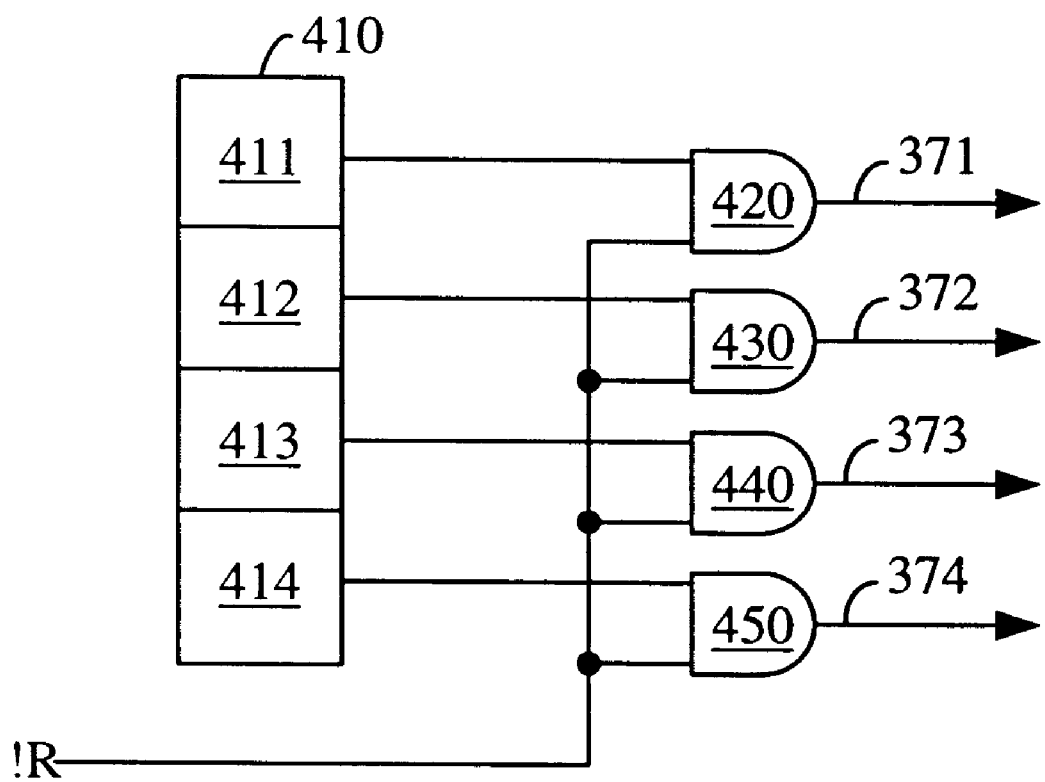
FIG. 4 is a schematic diagram of a disable circuit in accordance with the embodiment of FIG. 3.

FIG. 4 is an embodiment of disable circuit 370 which modifies a global reset signal !R. The embodiment of FIG. 4 comprises a write once configuration memory 410 and AND gates 420, 430, 440, and 450. FPGA 300 uses write once memory for disable circuit 370 so that an end user cannot modify FPGA 300 to enable CLBs that were disabled by the manufacturer. Write once configuration memory 410 comprises four write once memory cells 411, 412, 413, and 414. Global reset signal !R is coupled to an input terminal of AND gates 420, 430, 440, and 450. The other input terminals of AND gates 420, 430, 440, and 450 are coupled to write only memory cells 411, 412, 413, 414, respectively. The output terminals of AND gate 420, 430, 440, and 450 drive disable lines 371, 372, 373, and 374, respectively. As explained above, the embodiment of FIG. 3 uses active low reset lines. Therefore, if disable line 371 is forced to logic low, CLBs 341–345 are forced into a reset state. As long as disable line 371 remains at logic low, the CLBs of CLB column 340 cannot function since the CLBs are held in a reset state. Thus, CLB column 340 is disabled if disable line 371 remains in the logic low state. If write once memory cell 411 is programmed to be logic low, AND gate 420 drives disable line 371 to logic low regardless of the state of global reset line !R. Conversely, if write once memory cell 411 is programmed to be logic high, AND gate 420 drives disable line 371 to the same logic state as global reset line !R. Thus, programming a logic low into write only memory cell 411 disables CLB column 340. Conversely, programming a logic high into write once memory cell 411 enables CLB column 340. Similarly, programming a logic low into write only memory cells 412, 413, or 414 disables CLB column 350, CLB row 305, or CLB row 304, respectively.

Figure 5:
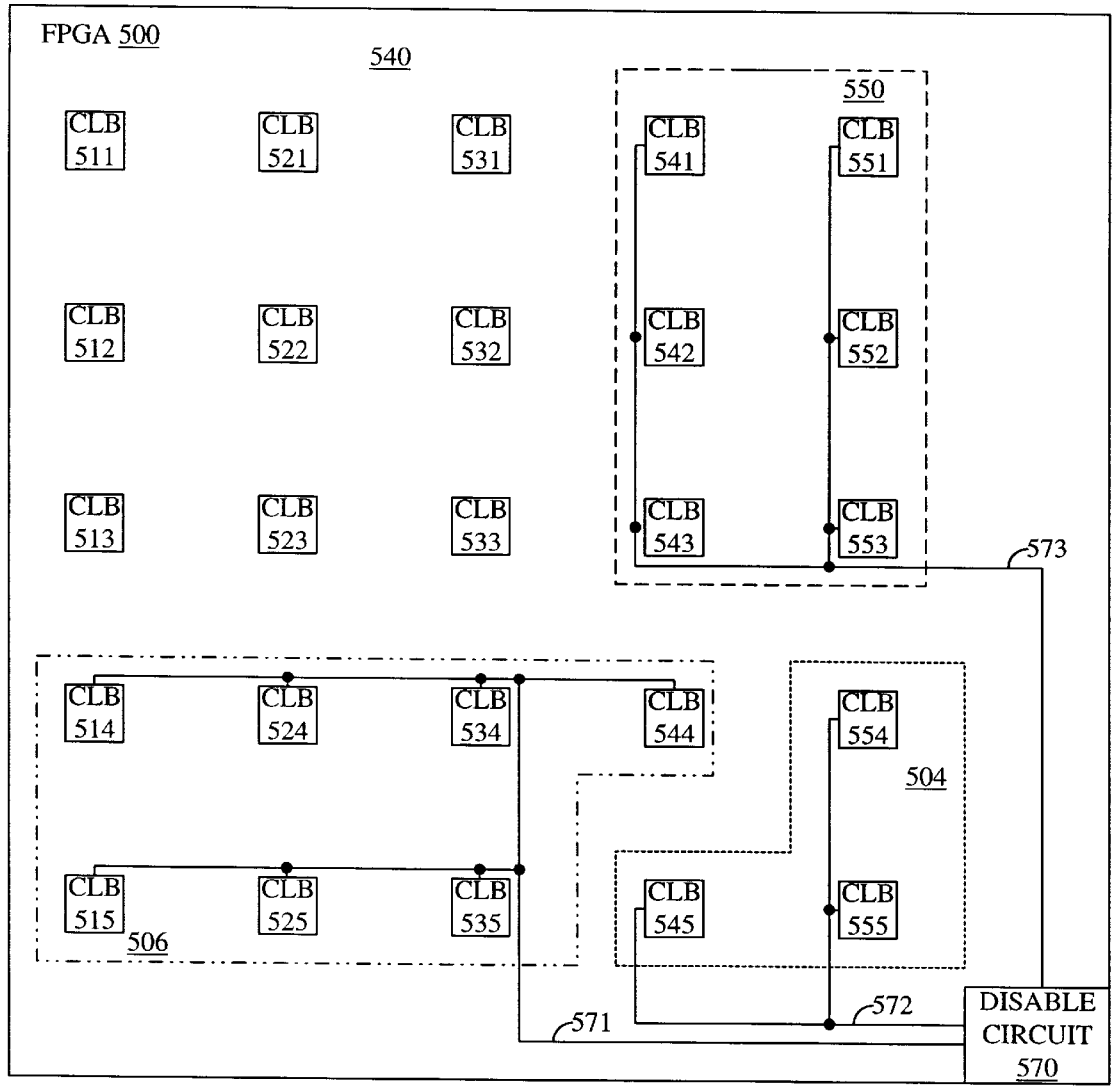
FIG. 5 is a simplified schematic diagram of an FPGA in accordance with a second embodiment of the present invention.

FIG. 5 is a simplified schematic diagram of an FPGA 500 in accordance with another embodiment of the present invention. The programmable interconnect, IOB, and PADs of FPGA 500 are omitted in FIG. 5 for clarity. FPGA 500 comprises an array of CLBs, a disable circuit 570, and disable signals 571–573. FPGA 500 can be pre-configured with various built-in functions that may not all be needed simultaneously. For example, CLB group 550, which comprises CLBs 541–543 and 551–553, may be pre-configured to be a PCI interface; while CLB group 504, which comprises CLBs 545, 554, and 555, may be pre-configured to be an SBUS interface. Thus, FPGA 500 can be used in systems using either PCI bus or SBUS. However, the manufacturer of FPGA 500 may be able to price an SBUS version of FPGA 500 differently from a PCI bus version. Thus, the manufacturer of FPGA 500 would desire to create two separate product lines with FPGA 500. Therefore, portions of FPGA 500 can be selectively disabled to create several product lines from FPGA 500.

Specifically, disable circuit 570 can disable CLB group 550 by driving disable line 573 to a disable logic state. Similarly, disable circuit 570 can disable CLB group 504 by driving disable line 572 to a disable logic state. Furthermore, disable circuit 570 can disable a CLB group 506, comprising CLBs 514, 515, 524, 525, 534, 535, and 544, by driving disable line 571 to the disable logic state. An FPGA that includes on-board memory for pre-configuration is described by Lawman in U.S. patent application Ser. No. 09/000,519, entitled "DECODER STRUCTURE AND METHOD FOR FPGA CONFIGURATION" by Gary R. Lawman.

Figure 6:
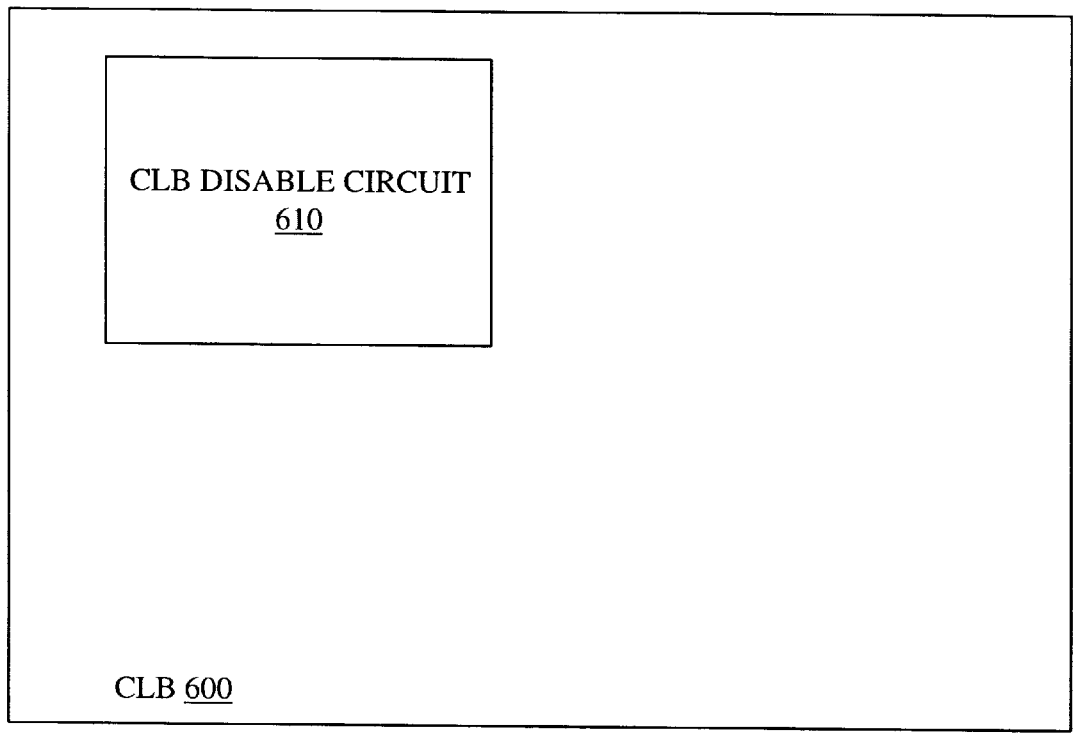
FIG. 6 is a simplified schematic diagram of an configurable logic block (CLB) in accordance with one embodiment of the present invention.

FIG. 6 shows a CLB 600 for an FPGA in accordance with another embodiment of the present invention. CLB 600 comprises a CLB disable circuit 610 that can be programmed after manufacturing of the FPGA to either disable or enable CLB 600. Thus, in an FPGA using CLB 600 in place of standard CLBs, each CLB can be individually enabled or disabled after manufacturing of the FPGA. Thus, the FPGA manufacturer need only manufacture a single type of FPGA to be able to offer multiple families of FPGAs having varying CLB matrix sizes as well as different pre-configured functionality.

Figure 7:
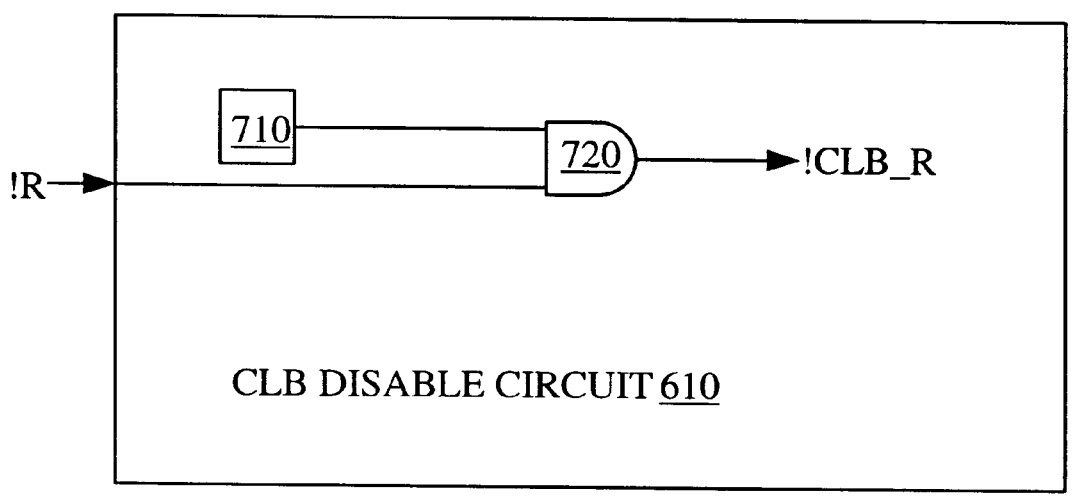
FIG. 7 is a schematic diagram of a CLB disable circuit in accordance with the embodiment of FIG. 6.

FIG. 7 is one embodiment of disable circuit 610 in accordance with the present invention. The embodiment of FIG. 7 comprises a write once memory cell 710 and an AND gate 720. Global reset signal !R is coupled to a first input terminal of AND gate 720. Write once memory cell 710 is coupled to a second input terminal of AND gate 720. AND gate 720 drives a CLB reset signal !CLB_R at the output terminal of AND gate 720. CLB reset signal !CLB_R is coupled to the reset terminals (not shown) of the other circuits (not shown) of CLB 600. CLB reset signal !CLB_R is an active low signal. Thus, if CLB reset signal !CLB_R is maintained at logic low, CLB 600 is forced into a reset state and effectively disabled. If write once memory cell 710 is programmed to logic low, CLB reset signal !CLB_R is driven to logic low by AND gate 720 regardless of the state of global reset signal !R. Conversely, if write once memory cell 710 is programmed to logic high, AND gate 720 drives CLB reset signal !CLB_R to be equal to the same logic state as global reset signal !R. Therefore, CLB 600 is disabled if write once memory cell 710 is programmed to logic low and enabled if write once memory cell 710 is programmed to logic high.

Figure 8:
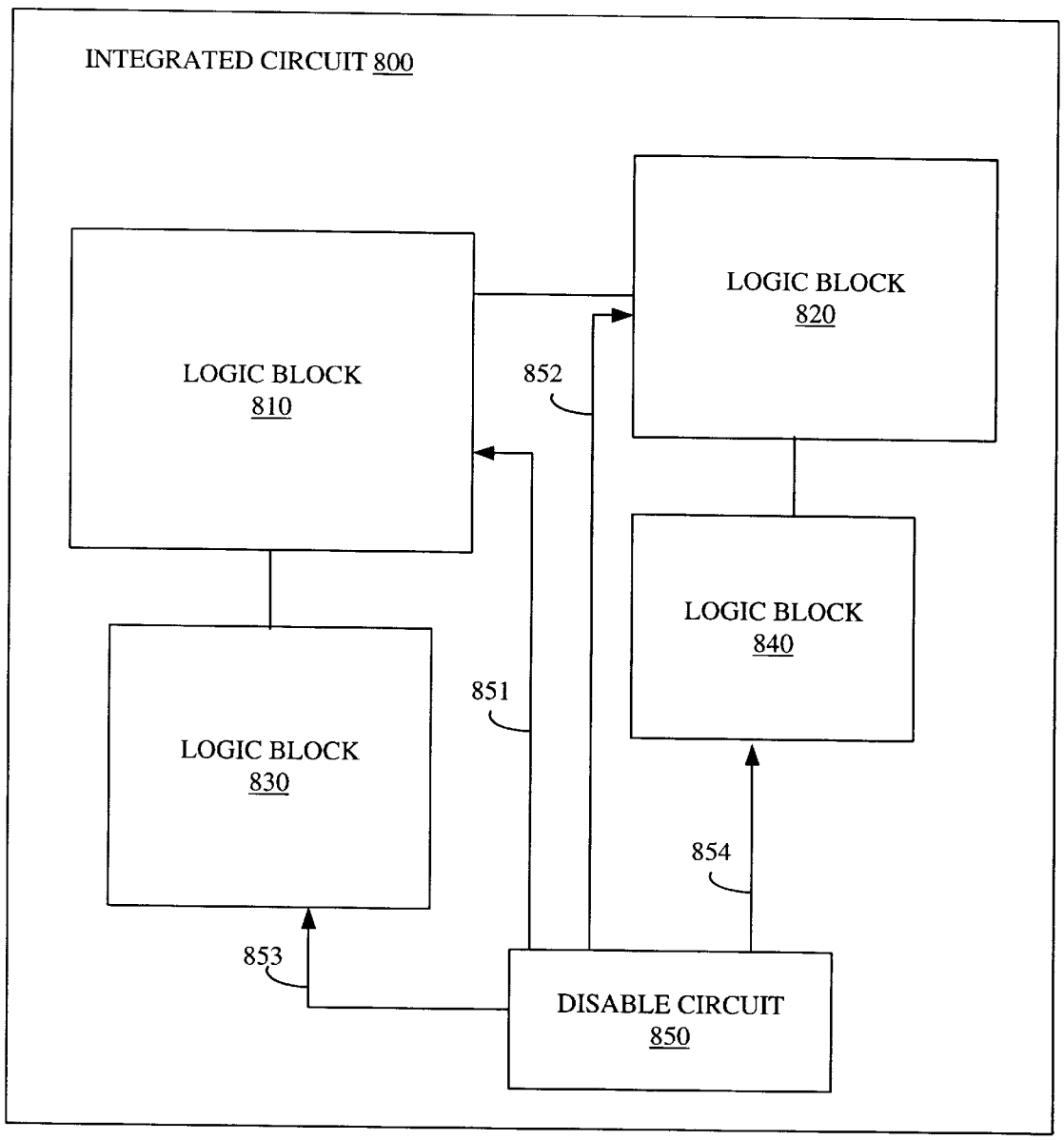
FIG. 8 is a schematic diagram of an integrated circuit in accordance with one embodiment of the present invention.

The principles of the present invention are also applicable to integrated circuits other than FPGAs. For example, FIG. 8 shows an integrated circuit 800 incorporating the principles of the present invention. Integrated circuit 800 comprises logic blocks 810, 820, 830, and 840, and a disable circuit 850. In integrated circuit 800, logic block 810 is coupled to logic blocks 820 and 830. Logic block 820 is also coupled to logic block 840. Disable circuit 850 drives disable lines 851, 852, 853, and 854, to logic blocks 810, 820, 830, and 840, respectively. Disable circuit 850 is configurable to disable a logic block by driving the corresponding disable line to a disable logic state. For example, disable circuit 850 can be configured to disable logic block 810 by driving disable line 851 to the disable logic state. The disable circuit of FIG. 4 can be used to implement disable circuit 850. By selectively disabling logic blocks within integrated circuit 800, an IC manufacturer can design and manufacture a single IC and customize specific instances of integrated circuit 800 to produce multiple product lines from the single IC.

Figure 9:
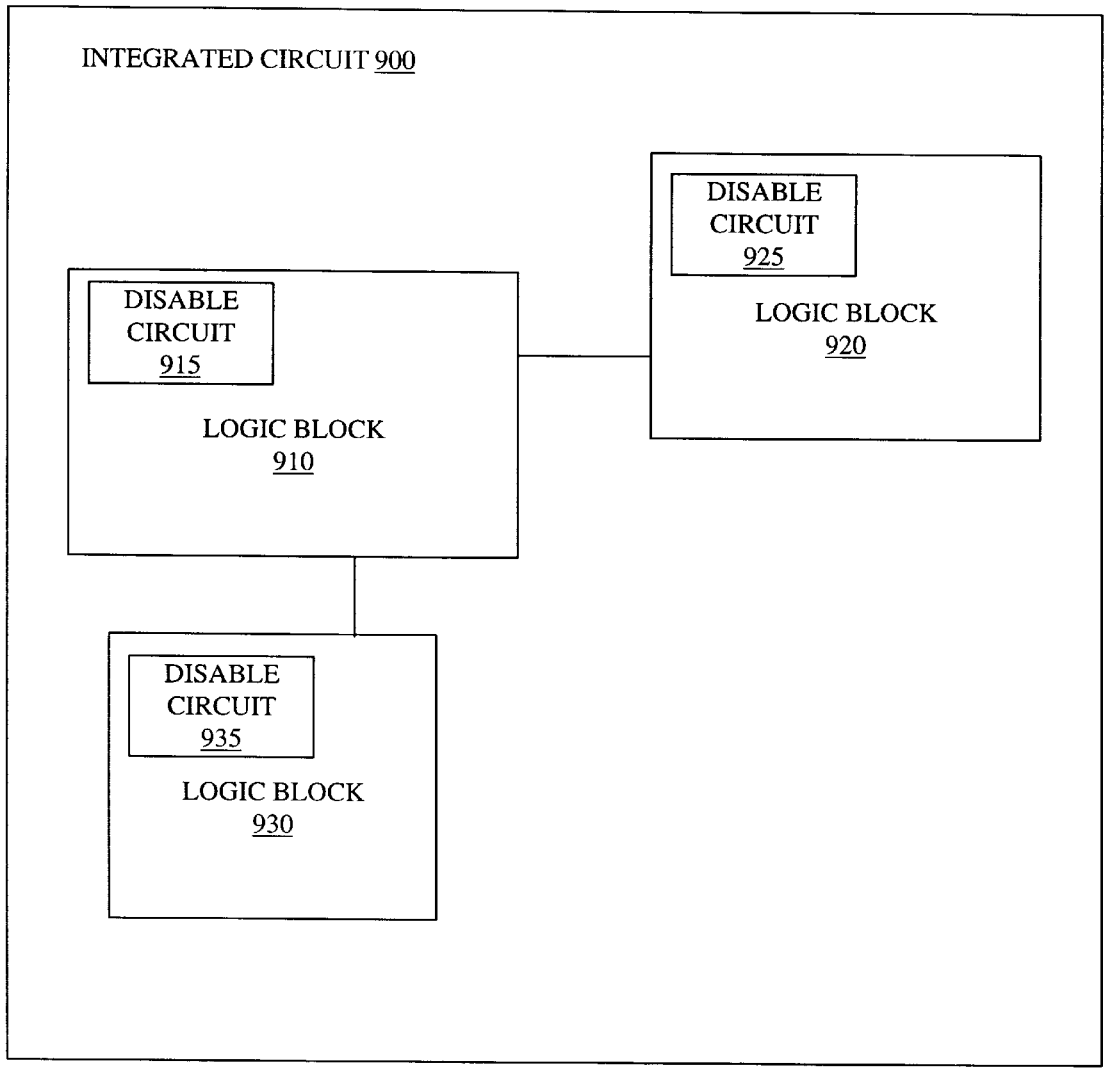
FIG. 9 is a schematic diagram of an integrated circuit in accordance with one embodiment of the present invention.

FIG. 9 shows an integrated circuit 900 using another embodiment of the present invention. Integrated circuit 900 includes logic blocks 910, 920, and 930. Each logic block of integrated circuit 900 includes a disable circuit that is configurable to disable the logic block. Specifically, logic block 910 contains a disable circuit 915 that is configurable to disable logic block 910. Similarly, logic blocks 920 and 930 contain disable circuits 925 and 935, respectively. Disable circuits 915, 925, and 935 can be implemented using the CLB disable circuit of FIG. 7.

Figure 10:
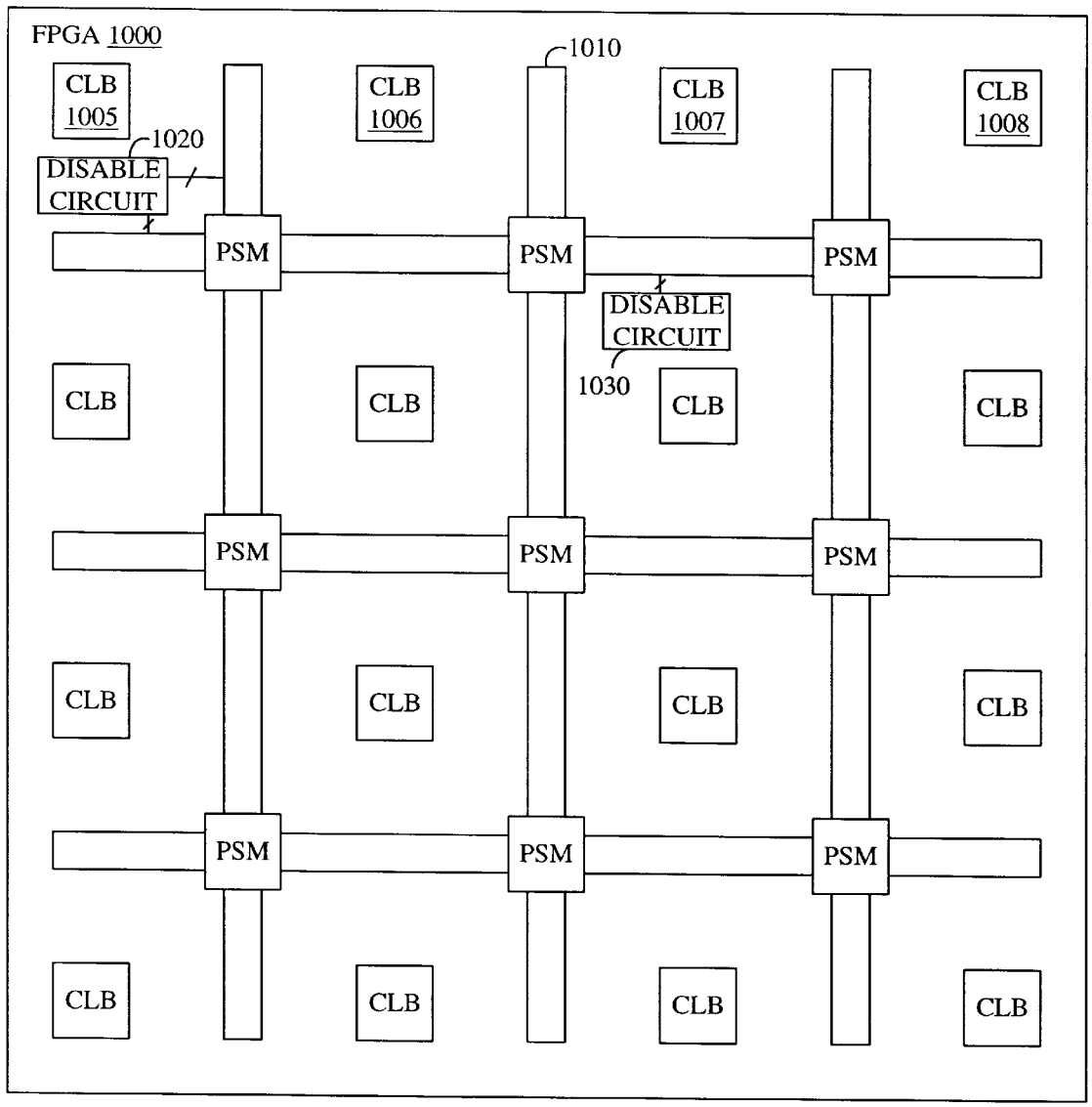
FIG. 10 is a schematic diagram of an integrated circuit in accordance with one embodiment of the present invention.

FIG. 10 is a simplified schematic diagram of an FPGA 1000 in accordance with one embodiment of the present invention. FPGA 1000 comprises an array of CLBs, programmable interconnect 1010, which contains programmable switch matrices (PSMs), and disable circuits 1020 and 1030. Typically, programmable interconnect 1010 comprises multiple interconnect lines that can be configured to electrically couple together different CLBs. In FPGA 1000, rather than directly disabling the CLBs, portions of programmable interconnect 1010 can be selectively disabled to isolate and render unusable various CLBs. For example, disable circuit 1020 can selectively ground a subset of the interconnect lines of programmable interconnect 1010 that are coupled to CLB 1005. Since the interconnect lines to CLB 1005 are grounded, CLB 1005 is rendered unusable. Depending on the exact configuration of programmable interconnect 1010, disable circuits can isolate groups of CLBs. For example, disable circuit 1030 can ground interconnect lines in programmable interconnect 1010 to able to isolate the row of CLBs comprising CLBs 1005–1008.

When specific CLBs have been isolated by grounding particular interconnect lines, the software that implements a user's design in the FPGA must not place user logic in the disabled CLBs, or attempt to route signals on the grounded interconnect lines. These prohibitions are easily built into the place and route software by tagging the interconnect lines or CLBs as having already been allocated. An additional advantage of this aspect of the invention is that blocking out portions of an FPGA from a place and route routine is easier than adapting software to support a new FPGA of a different size.

Figure 11:
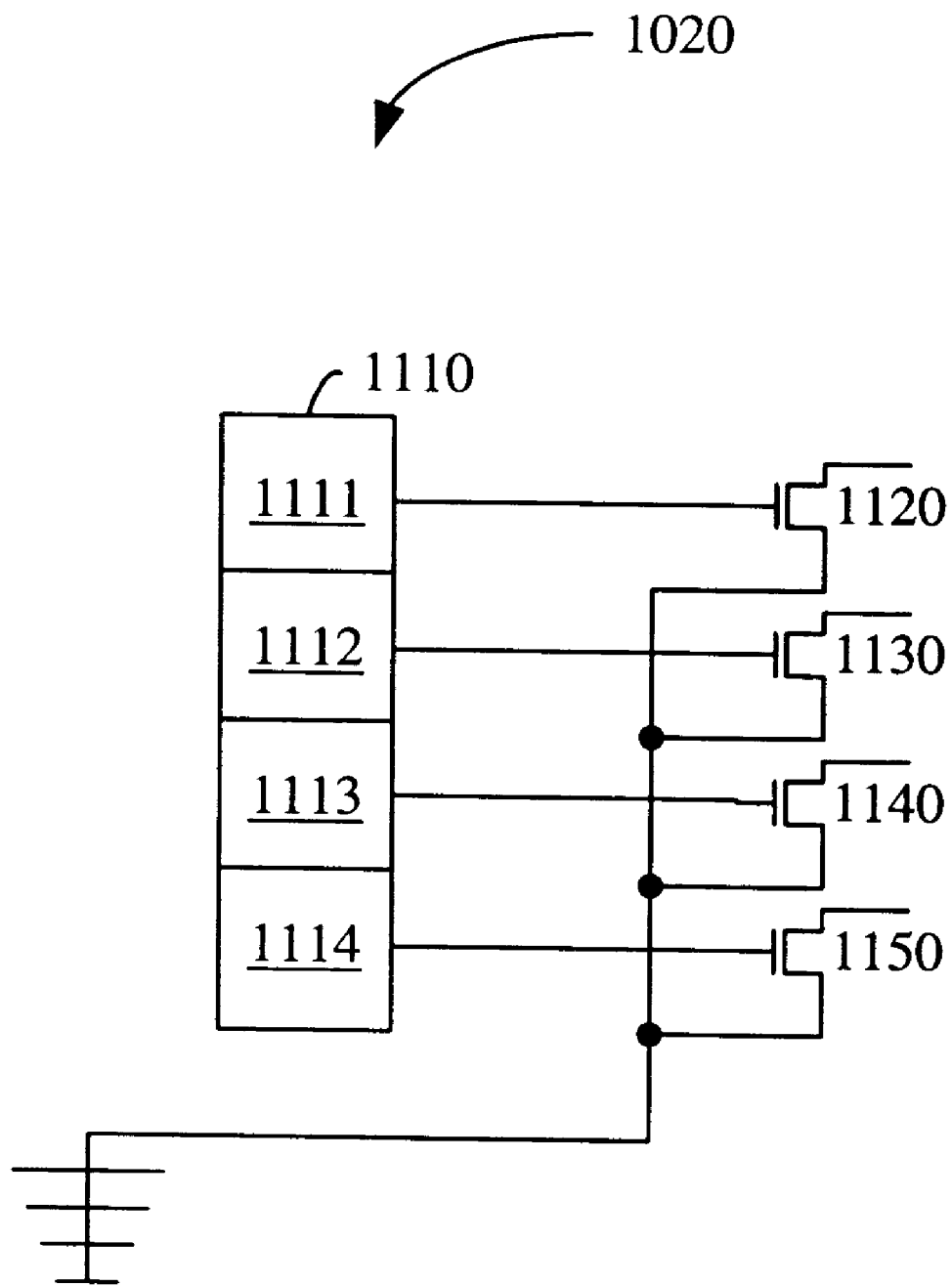
FIG. 11 is a schematic diagram of a disable circuit in accordance with the embodiment of FIG. 10.

FIG. 11 is an embodiment of disable circuit 1020 that can also be used for disable circuit 1030. The embodiment of FIG. 11 comprises a write once configuration memory 1110 and transistors 1120, 1130, 1140, and 1150. FPGA 1000 uses write once memory for disable circuit 1020 so that an end user cannot modify FPGA 1000 to enable interconnect lines that were disabled by the manufacturer. Write once configuration memory 1110 comprises four write once memory cells 1111, 1112, 1113, and 1114, which are coupled to the control terminals of transistors 1120, 1130, 1140, and 1150, respectively. Different embodiments of disable circuit 1020 may contain a different number of write once memory cells and transistors. A first power terminal of transistors 1120, 1130, 1140, and 1150 is coupled to ground. The second power terminals of transistors 1120, 1130, 1140, and 1150 are each coupled to a different interconnect line. If write once memory cell 1111 is programmed to be logic high, transistor 1120 grounds the interconnect line coupled to the second power terminal of transistor 1120. Conversely, if write once memory cell 1111 is programmed to be logic low, transistor 1120 is turned off and does not measurably influence the interconnect line connected to the second power terminal of transistor 1120. Similarly, programming a logic high into write only memory cells 1112, 1113, or 1114 grounds the interconnect line coupled to transistors 1130, 1140, and 1150, respectively.

In the various embodiments of this invention, methods and structures have been described to configure a single silicon implementation of an IC into different IC families having different functionality and capacity. For example, CLBs within an FPGA are selectively disabled to remove functionality or to reduce the capacity of the FPGA. To maximize flexibility, the disabling of the logic blocks is usually performed after manufacturing of the IC but before shipping the IC to an end user. Thus, an IC manufacturer can provide a family of FPGAs while only expending the cost to design and manufacture a single implementation of the IC.

The various embodiments of the structures and methods of this invention that are described above are illustrative only of the principles of this invention and are not intended to limit the scope of the invention to the particular embodiments described. For example, in view of this disclosure, those skilled in the art can define other ICs, logic blocks, disable circuits, CLB disable circuits, CLB groups, CLB columns, CLB rows, CLB matrices, configuration devices, FPGAs, CLBs, IOBs, PSMs, configuration access ports, configuration ports, and so forth, and use these alternative features to create a method, circuit, or system according to the principles of this invention. Thus, the invention is limited only by the following claims.

What is claimed is:

1. An integrated circuit comprising:
    a plurality of logic blocks; and
    a disable circuit coupled to a first logic block of said plurality of logic blocks, wherein said disable circuit is configurable to disable said first logic block.

2. The integrated circuit of claim 1, wherein said disable circuit is coupled to a second logic block of said plurality of logic blocks and wherein said disable circuit is configurable to disable said second logic block.

3. The integrated circuit of claim 2, wherein said integrated circuit is a field programmable gate array (FPGA).

4. The integrated circuit of claim 3, wherein said plurality of logic blocks is a matrix of configurable logic blocks.

5. The integrated circuit of claim 4, wherein said first logic block is a row of configurable logic blocks.

6. The integrated circuit of claim 5, wherein said second logic block is a column of configurable logic blocks.

7. The integrated circuit of claim 1, further comprising a first disable line driven by said disable circuit to said first logic block.

8. The integrated circuit of claim 7, wherein said disable circuit drives said first disable line to a disable state to disable said first logic block.

9. The integrated circuit of claim 7, further comprising a global reset line coupled to said disable circuit.

10. The integrated circuit of claim 9, wherein said disable circuit comprises:
    an AND gate having a first input terminal, a second input terminal coupled to said global reset line, and an output terminal coupled to said first disable line; and
    a write once memory cell coupled to said first input terminal of said AND gate.

11. The integrated circuit of claim 2, further comprising:
    a global reset line coupled to said disable circuit;
    a first disable line driven by said disable circuit to said first logic block; and
    a second disable line driven by said disable circuit to said second logic block.

12. The integrated circuit of claim 11, wherein said disable circuit comprises:
    a first AND gate having a first input terminal, a second input terminal coupled to said global reset line, and an output terminal coupled to said first disable line;
    a first write once memory cell coupled to said first input terminal of said first AND gate;
    a second AND gate having a first input terminal, a second input terminal coupled to said global reset line, and an output terminal coupled to said second disable line; and
    a second write once memory cell coupled to said first input terminal of said second AND gate.

13. An integrated circuit comprising:
    a first logic block having a first disable circuit configurable to disable said first logic block; and
    a second logic block coupled to said first logic block.

14. The integrated circuit of claim 13, wherein said second logic block comprises a second disable circuit configurable to disable said second logic block.

15. The integrated circuit of claim 13, further comprising a third logic block coupled to said first logic block, wherein said third logic block comprises a third disable circuit configurable to disable said third logic block.

16. The integrated circuit of claim 13, further comprising a global reset line coupled to said first logic block and said second logic block.

17. The integrated circuit of claim 16, wherein said first disable circuit comprises:
 a reset terminal;
 an AND gate having a first input terminal, a second input terminal coupled to said global reset line, and an output terminal coupled to said reset terminal; and
 a write once memory coupled to said first input terminal of said AND gate.

18. The integrated circuit of claim 13, wherein said integrated circuit is a field programmable gate array (FPGA).

19. The integrated circuit of claim 13, further comprising a programmable interconnect coupled to said first logic block and said second logic block.

20. The integrated circuit of claim 19, wherein:
 said first logic block is a first configurable logic block; and
 said second logic block is a second configurable logic block.

21. An integrated circuit comprising:
 a programmable interconnect;
 a first logic block coupled to said programmable interconnect;
 a second logic block coupled to said programmable interconnect; and
 a disable circuit coupled to said programmable interconnect, wherein said disable circuit is configurable to disable portions of said programmable interconnect.

22. The integrated circuit of claim 21, wherein said programmable interconnect comprises a plurality of interconnect lines and wherein said disable circuit is configurable to ground a subset of said interconnect lines.

23. The integrated circuit of claim 21, wherein said disable circuit comprises:
 a write once memory cell; and
 a transistor having a control terminal coupled to said write once memory cell, a first power terminal coupled to ground, and a second power terminal coupled to said programmable interconnect.

24. The integrated circuit of claim 21, wherein said integrated circuit is a field programmable gate array.

* * * * *